United States Patent
Feiweier

(10) Patent No.: US 7,728,588 B2
(45) Date of Patent: Jun. 1, 2010

(54) MAGNETIC RESONANCE IMAGING DATA ACQUISITION SEQUENCE AND APPARATUS

(75) Inventor: Thorsten Feiweier, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 286 days.

(21) Appl. No.: 11/851,462

(22) Filed: Sep. 7, 2007

(65) Prior Publication Data

US 2008/0061779 A1 Mar. 13, 2008

(30) Foreign Application Priority Data

Sep. 13, 2006 (DE) ........................ 10 2006 042 998

(51) Int. Cl.
*G01V 3/00* (2006.01)
(52) U.S. Cl. ................... 324/309; 324/307; 324/306; 324/318
(58) Field of Classification Search ......... 324/300–322; 600/410, 422, 423
See application file for complete search history.

(56) References Cited

U.S. PATENT DOCUMENTS

| 5,561,370 | A | 10/1996 | Fuderer ........................ 324/309 |
| 6,888,349 | B2 | 5/2005 | Fautz .......................... 324/309 |
| 7,132,827 | B2 * | 11/2006 | Griswold et al. ............. 324/309 |
| 7,245,124 | B2 * | 7/2007 | Shu et al. ..................... 324/307 |
| 7,245,125 | B2 * | 7/2007 | Harer et al. .................. 324/310 |
| 7,265,547 | B2 * | 9/2007 | Vu .............................. 324/309 |
| 7,319,324 | B2 * | 1/2008 | Kannengießer et al. ..... 324/309 |
| 7,408,345 | B2 * | 8/2008 | Bammer et al. ............. 324/307 |
| 7,429,862 | B2 * | 9/2008 | Kholmovski et al. ........ 324/310 |
| 7,439,739 | B2 * | 10/2008 | Beatty ......................... 324/309 |
| 7,479,782 | B2 * | 1/2009 | Van Den Brink ............ 324/307 |
| 7,495,437 | B2 * | 2/2009 | Griswold et al. ............ 324/307 |
| 7,511,489 | B2 * | 3/2009 | Fautz et al. .................. 324/307 |
| 7,595,639 | B2 * | 9/2009 | Bayram et al. .............. 324/307 |
| 2002/0167319 | A1 | 11/2002 | Ikezaki ....................... 324/307 |
| 2005/0073303 | A1 * | 4/2005 | Harer et al. .................. 324/307 |
| 2005/0187458 | A1 * | 8/2005 | Kannengiesser et al. .... 600/410 |
| 2005/0264287 | A1 * | 12/2005 | Griswold et al. ............ 324/309 |

(Continued)

OTHER PUBLICATIONS

"Bunched Phase Encoding (BPE): A New Fast Data Acquisition Method in MRI," Moriguchi et al, Magnetic Resonance in Medicine, vol. 56 (2006) pp. 633-648.

*Primary Examiner*—Brij B Shrivastav
*Assistant Examiner*—Tiffany A Fetzner
(74) *Attorney, Agent, or Firm*—Schiff Hardin LLP

(57) ABSTRACT

In a measurement sequence and apparatus for three-dimensional magnetic resonance imaging, in which an acquisition of measurement data ensues by scanning multiple lines in k-space; and the number of k-space lines is apportioned among a number of partial acquisitions so that scanning of associated k-space lines occurs in each partial acquisition, the k-space lines are associated with the partial acquisitions such that the association corresponds to the following association rule: (a) evaluation of each k-space line with a distance measure that characterizes the distance of the respective k-space line relative to the k-space center, (b) arrangement of the k-space lines to be scanned in an order dependent on the distance measure, (c) grouping of the k-space lines arranged in order into a number of groups with a number of successive k-space lines being combined into a group, and (d) association of the k-space lines with the partial acquisitions by, for each group, the k-space lines combined into this group are apportioned to different partial acquisitions.

15 Claims, 10 Drawing Sheets

U.S. PATENT DOCUMENTS

2006/0226836 A1* 10/2006 Shu et al. .................... 324/309
2007/0063701 A1* 3/2007 Vu ............................. 324/307
2008/0061779 A1* 3/2008 Feiweier ..................... 324/307
2009/0082656 A1* 3/2009 Bayram et al. .............. 600/410

* cited by examiner

MAGNETIC RESONANCE IMAGING DATA ACQUISITION SEQUENCE AND APPARATUS

BACKGROUND OF THE INVENTION

1. Field of the Invention

The present invention concerns a measurement (data acquisition) sequence for three-dimensional magnetic resonance imaging suitable for use for production of magnetic resonance images that are optimally free of movement artifacts, as well as a magnetic resonance apparatus for this purpose.

2. Description of the Prior Art

Magnetic resonance (MR) technology is a known modality with which images of the inside of an examination subject can be obtained. The examination subject is positioned in a strong, static, homogeneous basic magnetic field (field strengths from 0.2 Tesla to 7 Tesla and more) in an MR apparatus such that the nuclear spins of said examination subject become oriented along the basic magnetic field. To excite magnetic resonances, radio-frequency excitation pulses are radiated into the examination subject, and the excited magnetic resonances are measured and MR images are reconstructed based thereon. Rapidly-switched magnetic gradient fields are superimposed on the basic magnetic field for spatial coding of the measurement data. The acquired measurement data are digitized and stored as complex number values in a k-space matrix. By multi-dimensional Fourier transformation, an MR image can be reconstructed from the k-space matrix populated with these measured values.

Due to its relatively long measurement time, MR imaging is movement-sensitive, meaning that movement of the examination subject during the acquisition of the measurement data can lead to somewhat significant limitations in the image quality.

Therefore, various methods and/or measurement sequences exist with the goal to achieve a reduction of the sensitivity to movements of the examination subject so that an improved reconstruction of the image data is enabled.

Relatively complicated methods utilize external markers and superstructures with which movement in three dimensions in space can be detected and evaluated with optical means. However, such methods require additional hardware, and thus incur a high cost expenditure and are uncomfortable due to the necessary markings on the patient, so that such methods are typically used only to a limited extent.

Methods are also known using a special design of the measurement sequence that enables movement detection. For example, by a special design of the measurement sequence, an over sampling of a central region of k-space can ensue and the information obtained in this manner can be used for improved image reconstruction and for reduction of movement artifacts.

For example, in the acquisition of measurement data in the PROPELLER technique (also known as the BLADE technique) a k-space matrix is scanned (sampled) in segments, whereby the individual k-space segments are rotated relative to one another so that a central k-space region is scanned with each k-space segment. The over-sampling of the central k-space region enables a movement that occurs between the scanning of the individual k-space segments to be detected and to be taken into account in the image reconstruction. Other methods utilize spiral or radial k-space trajectories or an averaging of multiple, redundantly acquired measurement data, for example.

A disadvantage in this method is that the additional requirements necessary for over-sampling affect measurement time. Moreover, given non-Cartesian sampling, artifacts may accrue that originate from a non-optimal translation of the acquired measurement data to a Cartesian grid ("regridding").

The methods described herein are typically tailored to the specific design of the employed measurement sequence and therefore allow a modification of the measurement sequence within narrow limits without degrading the implementation capability of the method. Many of the methods cannot be transferred to Cartesian scanning schemes without further measures.

Another method used in many cases for detection and/or for correction of movements occurred during the acquisition of the measurement data is the utilization of navigator signals, also called navigator echoes.

In this type of acquisition additional data (known as navigator signals) are acquired in addition to the actual measurement data with which the k-space matrix corresponding to the image to be produced is populated. These navigator signals allow movement of the examination subject acquired during the acquisition of the measurement data to be detected and, if necessary, to allow this to be taken into account in the reconstruction or the MR image or MR images so that movement artifacts are reduced.

A smaller region of the k-space matrix (for example one k-space row or a small central section of the k-space matrix) is typically scanned with navigator signal. A movement that may have occurred between the scanning of two navigator signals can be detected and/or taken into account in the image reconstruction by a comparison of the k-space values scanned by the navigator signal with regard to their amplitude and phase. Different types of navigator signals are known. Cloverleaf, orbital or spherical navigator signals are examples.

For a measurement sequence in which such navigator signals are acquired, the measurement duration of the measurement sequence and the subsequent image reconstruction sometimes increase significantly depending on the complexity of the navigator signals.

There is therefore a need to further develop measurement sequences that allow improvement of the image quality if and when movement of the examination subject occurs.

SUMMARY OF THE INVENTION

An object of the invention is to provide a measurement sequence with which a good image quality is achieved with simultaneous low measurement time and versatile usage capability, in spite of a possible movement of an examination subject. Furthermore, it is an object of the invention to provide a method for generation of such a measurement sequence as well as a magnetic resonance apparatus with which such a measurement sequence can be executed.

Acquisition of measurement data by scanning multiple k-space lines in k-space ensues in the inventive measurement sequence for three-dimensional magnetic resonance imaging, the multiple k-space lines being divided into partial acquisitions so that scanning of associated k-space lines occurs in each partial acquisition, and the k-space lines are associated with the partial acquisitions such that the association corresponds to the following association rule:

evaluation of each k-space line with a distance measure that characterizes the distance of the respective k-space line relative to a k-space center, arrangement of the k-space lines to be scanned in order under consideration of the distance measure, grouping of the k-space lines arranged in order into a number of groups, with a number of successive k-space lines are respectively combined into each group, and association of the k-space lines with the partial acquisitions, wherein, in each group the k-space lines combined into this group are apportioned to different partial acquisitions.

The division of the k-space lines in the inventive measurement sequence is thus based on the principle that the k-space lines are distributed to the individual partial, acquisitions such that both center-proximal and center-distal k-space lines are scanned in each partial acquisition. This is achieved by k-space lines with approximately comparable distance from the k-space center (thus k-space lines respectively following one another in order) are combined into a number of groups, and the k-space lines of each group are distributed to various partial acquisitions. Division of k-space lines with comparable distance from the k-space center to various partial acquisitions thus ensues.

The partial acquisitions themselves are successively acquired in the measurement sequence. The scanning of the k-space lines proximal and distal to the k-space center is thus widely, uniformly distributed over-the measurement time.

In comparison to scanning schemes in which k-space is divided by the partial acquisitions into contiguous segments that are then successively scanned by the partial acquisition this provides a number of advantages. For the most part a separate consideration of the phase coding directions and a segmentation of k-space built hereupon ensues given such scanning schemes. The segments of k-space are for the most part contiguous and exhibit distinctly different distance from the k-space center. If a movement of the examination subject. (for example a patient) occurs between two partial acquisitions, the movement is reflected per segment in k-space in the acquired k-space data. An image reconstructed from this typically exhibits visible artifacts, for example ghost image displacements. Such artifacts in particular occur strongly and clearly visible when the movement occurs during the scanning of a segment lying near to the k-space center.

In contrast to this, the division of the k-space lines in the inventive measurement sequence ensues using an evaluation of the position of the k-space line in k-space instead. This evaluation is effected by a distance measure into which the phase coding directions identifying the position of the k-space line in three-dimensional k-space mutually enter. In this context, "evaluation" means that each k-space line that is evaluated is associated with its respective distance measure. By the association rule, given a partial acquisition the k-space lines are distributed uniformly across k-space with regard to the distance from the center of k-space. K-space lines that are comparable relative to their distance from k-space are thus scanned in each partial acquisition. When a momentary movement of the examination subject now occurs between the partial acquisitions, the k-space data altered by the movement are generally uniformly distributed across k-space with regard to the distance from the k-space center. Furthermore, since typically only a portion of the partial acquisitions are plagued by artifacts due to the movement of the examination subject, a majority of the acquired k-space lines in the k-space center are scanned without movement of the examination subject, which leads to an advantageous averaging of the artifacts. The reconstructed image exhibits distinctly fewer artifacts.

The association rule according to which the k-space lines to be scanned are apportioned to partial acquisitions can be employed in many different types of measurement sequences that are used for three-dimensional MR imaging, particularly in measurement sequences wherein the k-space lines can be characterized by at least two phase coding directions. For example, such measurement sequences are three-dimensional turbo spin echo sequences, three-dimensional turbo gradient echo sequences, three-dimensional gradient echo sequences, three-dimensional steady-state sequences such as, for example, three-dimensional TrueFISP sequences ("True Fast Imaging with Steady Precession"). As explained in more detail below, a division of the measurement sequence into partial sequences can result from the specific design of the measurement sequence itself, or can be randomly predetermined. The association rule of the inventive measurement sequences can also be employed in imaging methods with three phase coding directions as are used, for example, in CSI methods ("chemical shift imaging") in magnetic resonance spectroscopy.

The distance measure with which the distance relative to a k-space center is determined can be determined in a number of ways. A distance measure that is simple to determine is, for example, the Euclidean distance norm of one k-space line to the k-space center, for example a predefined central point in k-space. Modifications of the Euclidean distance norm (for example by scalings of k-space or of the k-space coordinate axes based on the size of k-space to be scanned) or other distance norms can also be used as a distance measure when this appears to be advantageous.

After evaluation of the k-space lines with distance measure, an arrangement of the k-space lines to be scanned ensues in an order (sequence) that is dependent on distance measure, particularly an arrangement of the k-space lines to be scanned in rising or falling order dependent on the distance measure. An association of the k-space lines with the individual partial acquisitions, such that an optimally uniform distribution of the k-space lines (with regard to their distance measure) to the partial acquisitions ensues, is now possible in a simple manner through the association rule.

In the grouping of the k-space lines arranged in order, S successive k-space lines are preferably combined into a group, S indicating the number of the partial acquisitions. In the allocation of the k-space lines to the S partial acquisitions, in each group the S successive k-space lines are apportioned to the S partial acquisitions.

A particularly uniform distribution of the k-space lines to the individual partial acquisitions thus can be achieved since essentially an identical number of k-space lines is associated with the partial acquisitions.

The k-space lines are advantageously arranged in k-space with no intersection. The k-space lines are advantageously parallel to a readout direction. In an advantageous embodiment, the k-space lines lie on a three-dimensional Cartesian grid.

In a Cartesian arrangement of the k-space lines in k-space, a simple division of the k-space lines through the association rule is also possible such that an optimally uniform distribution of the k-space lines to the partial acquisitions with regard to their distance measure is achieved. Furthermore, in such arrangements (in particular, an arrangement of the k-space lines on a three-dimensional Cartesian grid), a particularly simple reconstruction of the image without additional interpolation artifacts from the acquired measurement data is possible.

The arrangement of the k-space lines to be scanned preferably ensues increasing in order depending on the distance measure, such that k-space lines that have a smaller distance measure (i.e. k-space lines with which a smaller distance measure is associated) are located in order before k-space lines that have a greater distance measure (i.e. k-space lines with which a larger distance measure has been associated).

The arrangement of the k-space lines to be scanned in order can be additionally modified dependent on the azimuthal position of the k-space lines in k-space. The apportionment of the k-space lines to the individual partial acquisitions can be additionally influenced in this manner so that now a desired azimuthal distribution of the k-space lines is also achieved by the individual partial acquisitions. The determination of the azimuthal position of the k-space lines in k-space can ensue in various manners. With a characterization of the position of a k-space line by specification of two coordinates of a phase coding plane, the azimuthal position can be determined, for example, by specification of the angle coordinates (which angle coordinates are associated with the coordinate pair) of the corresponding polar coordinate pair. A corresponding generalization to three-dimensional spherical coordinates is possible in an analogous manner.

A scanning order of the associated k-space lines within each partial acquisition is advantageously determined under consideration of the distance measure of the associated k-space lines. The scanning of the k-space lines is thereby controlled within a partial acquisition.

The scan order of the associated k-space lines within each partial acquisition is preferably tuned to the image contrast that varies during scanning of the associated k-space lines, such that the scanning of central k-space lines ensues at a point in time of the strongest image contrast. The quality of the images reconstructed from the measurement data increases in this manner.

Through the consideration of the azimuthal position of the k-space lines and via the consideration of a desired arrangement order of the k-space lines within a partial acquisition, it is possible to achieve various scan patterns and distributions in k-space of the k-space lines associated with a partial acquisition in addition to the largely uniform distribution of the k-space lines to the partial acquisitions.

The scanning of the k-space lines preferably ensues using spin echoes and/or gradient echoes. A multi-echo technique is advantageously used for scanning the k-space lines, in which technique multiple echoes with which a number of k-space lines are scanned follow after an excitation pulse. A natural division of the measurement sequence into partial acquisitions results in this manner, with a partial acquisition including the respective echoes acquired after an excitation pulse.

In another embodiment, a contrast preparation ensues before each partial acquisition. The capability of the contrast to be acquired to be influenced by the measurement sequence is increased in this manner.

The above object also is achieved in accordance with the present invention by a magnetic resonance apparatus that is designed and operated to implement the inventive method described above, including all embodiments thereof.

DESCRIPTION OF THE PREFERRED EMBODIMENTS

Figure 1:
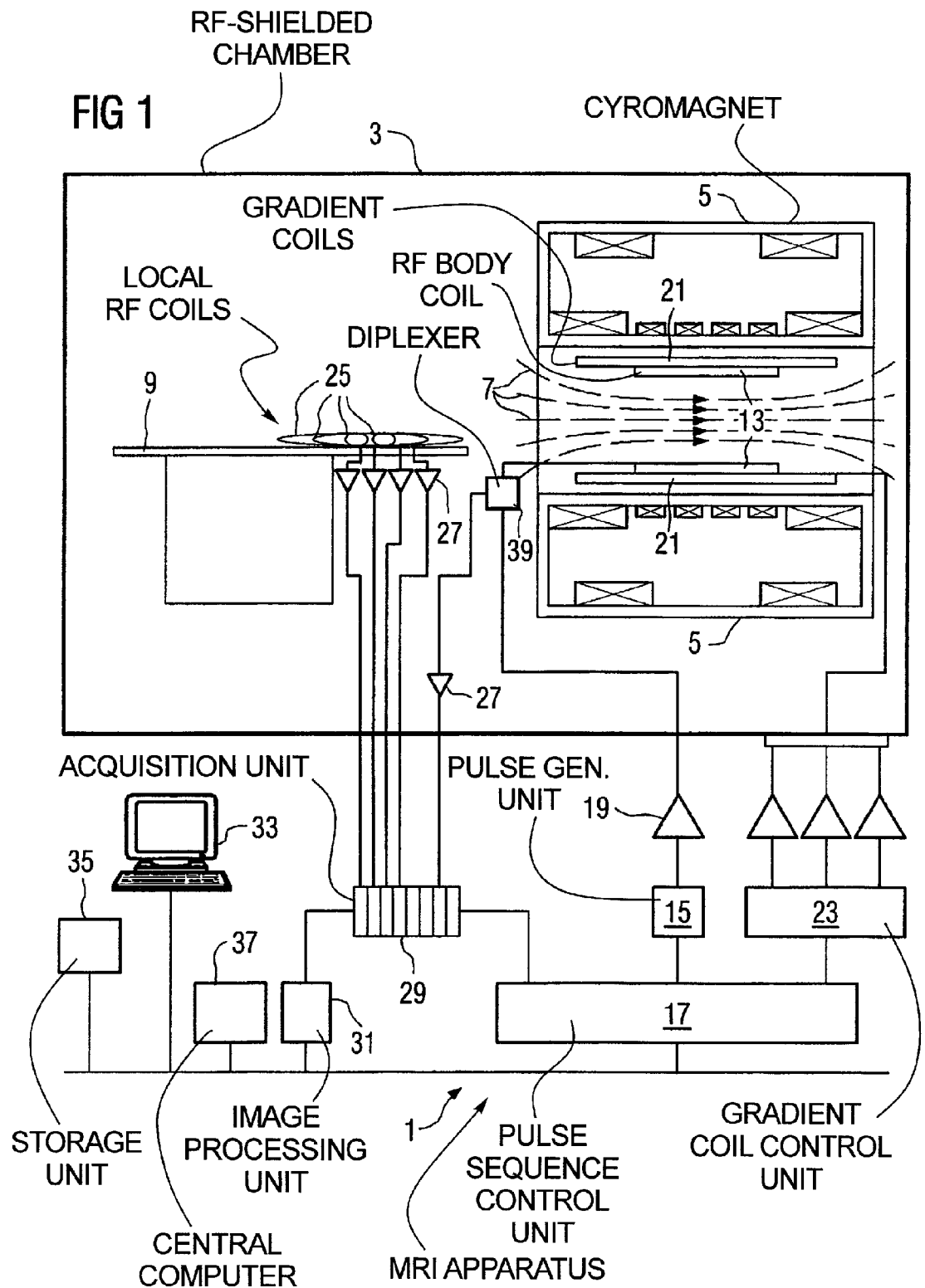
FIG. 1 schematically illustrates an MR apparatus.

FIG. 1 schematically shows the design of a magnetic resonance apparatus 1. The components of the magnetic resonance apparatus 1 with which the actual measurement is implemented are located in a radio-frequency-shielded measurement chamber 3. In order to examine a body by means of magnetic resonance imaging, various magnetic fields matched as precisely as possible to one another in terms of their temporal and spatial characteristics are radiated.

A strong magnet, typically a cryomagnet 5 with a tunnel-like opening, generates a static, strong basic magnetic field 7 that is typically 0.2 Tesla to 7 Tesla or more, that is largely homogeneous within a measurement volume. A body (not shown here) to be examined is placed on a patient bed 9 and positioned in the basic magnetic field 7, more precisely in the measurement volume.

The excitation of nuclear spins of the body ensues by magnetic radio-frequency excitation pulses that are radiated by a radio-frequency antenna (shown here as a body coil 13). The radio-frequency excitation pulses are generated by a pulse generation unit 15 that is controlled by a pulse sequence control unit 17. After amplification by a radio-frequency amplifier 19, they are conducted to the radio-frequency antenna. The radio-frequency system shown here is only schematically indicated. More than one pulse generation unit 15, more than one radio-frequency amplifier 19 and multiple radio-frequency antennas are typically used in a magnetic resonance apparatus 1.

Furthermore, the magnetic resonance apparatus 1 has gradient coils with which gradient fields are radiated for selective slice excitation or volume excitation and for spatial coding of the measurement signal in a measurement. The gradient coils 21 are controlled by a gradient coil control unit 23 that, like the pulse generation unit 15, is connected with the pulse sequence control unit 17.

The signals emitted by the excited nuclear spins are received by the body coil 13 and/or by local coils 25, amplified by associated radio-frequency pre-amplifiers 27, and further processed and digitized by an acquisition unit 29. The reception coils also can have multiple coil elements with which the magnetic resonance signals are acquired at the same time.

Given a coil that can be operated both in transmission mode and in reception mode, such as (for example) the body coil 13), the mode by an upstream transmission-reception diplexer 39.

An image processing unit 31 generates from the measurement data an image that is presented to a user at an operating console 33 or is stored in a storage unit 35. A central computer 37 controls the individual system components. The magnetic resonance apparatus 1 is fashioned for acquisition of measurement data with the inventive measurement sequence.

In the inventive measurement sequence, an acquisition of measurement data ensues by scanning a number of k-space lines in k-space, the number of k-space lines being divided into a number of partial acquisitions so that a scanning of associated k-space lines occurs given each partial acquisition. The division of the k-space lines corresponds to a specific association rule that is explained in detail using FIG. 2.

The determination of the k-space lines to be scanned ensues in a first step 51. The k-space lines to be scanned can be determined in various ways and can be adapted to the requirements of the k-space scanning and the measurement sequence. Some examples of how this determination can ensue are subsequently described without limitation.

K-space to be scanned, and therewith also the k-space lines to be scanned, are adapted to the image section to be shown ("field of view") and the spatial resolution, thus the extent of individual voxels. For example, the extent X of the image section, and the resolution x of the image section along one spatial dimension corresponding to both the k-space region K to be scanned, and the necessary density of the scan k along the corresponding dimension: $k=X/2\pi$, $K=2\pi/x$. This applies for each spatial dimension, in particular for each phase-coded spatial dimension. The extent of the k-space region to be scanned and the scan density can differ from spatial direction-to-spatial direction, for example given definition of a rectangular image section or given an anisotropic spatial resolution.

For a simple Cartesian scanning trajectory (path), all k-space lines lying on a grid are scanned. The scanning type can be varied starting from this. For example, it is possible to not scan each of these lines. Such an under-sampling enables a faster acquisition, but leads to image artifacts but these can be remedied at least in part with special methods. An oversampling of additional k-space lines placed on inter-grid spaces allows an improvement of the signal-to-noise ratio. The k-space lines to be scanned do not necessarily have to be arranged on a Cartesian grid and can deviate, partially or entirely from this.

Furthermore, it is possible to scan some or all k-space lines multiple times and to utilize this multiple scanning, for example for a signal averaging to increase the signal-to-noise ratio.

Furthermore, the quantity of the k-space coordinates to be scanned can be limited so that one or more k-space dimensions are scanned only in part, and/or partial Fourier techniques can be applied for reconstruction. This is possible, for example, insofar as only magnitude images should be generated. Due to the symmetry of the k-space data, the information required for the magnitude image is already contained in each half (per spatial dimension) in k-space.

Moreover, the quantity of the k-space coordinates to be scanned can be reduced by the use of elliptical k-space scanning. The corners of k-space are thereby excluded from the scanning since the information contained there does not contribute or contributes only insignificantly to the image content. For example, with two phase coding directions, up to four corners can be excluded from the scanning, and with three phase coding directions up to eight corners can be excluded.

Furthermore, in the use of parallel imaging techniques (for example, GRAPPA "GeneRalized Autocalibrating Partially Parallel Acquisition") all k-space lines do not have to be scanned.

Each of the k-space lines is respectively assigned a distance measure in a second step 53. The distance measure thereby indicates how distant a k-space line is from the center of k-space. The center of k-space can be, for example, the point in k-space with k-space coordinate values of zero, or can be a central k-space line, for example that k-space line whose phase coding directions respectively have the value of zero.

The k-space lines are arranged in an order $k_m$, m=1 ... N in a third step 55, whereby N is the number of the k-space lines to be scanned in total. The arrangement ensues under consideration of the distance measure, such that the k-space lines are arranged with regard to their distance from the k-space center such that k-space lines that are more central (in order) are located before peripheral k-space lines.

In principle various types of distance measures can be used. A simple distance measure is, for example, the Euclidean distance norm with which the distance of a k-space line from the center of k-space can be assessed. This distance norm can furthermore be modified by scaling the axes of k-space, for example in order to adapt the association of the k-space lines to the specific shape of k-space to be scanned (for example to a block-shaped k-space).

In the following an example is described with which a distance measure can be calculated. For this the generality is assumed (without limitation) that the k-space lines are arranged in parallel in k-space so that their position in k-space can be characterized by the specification of two coordinates $k_x$ and $k_y$, along two phase coding directions x and y. A distance measure d can now be determined by the following correlation:

$$d(k_x, k_y) = ((k_x - k^0_x)/K_x)^2 + ((k_y - k^0_y)/K_y)^2,$$

whereby $k^0_x$ and $k^0_y$ specify the coordinates of the k-space center and $K_x$ and $K_y$ specify the size of the k-space matrix in the x-direction or y-direction.

After arrangement of the k-space lines in an order (sequence) with regard to the distance measure, a number of the partial acquisitions to which the k-space lines are apportioned is determined in a fourth step 57. A partial acquisition is characterized by the k-space lines associated with the partial acquisition being scanned.

Depending on the sequence type used, a division of the measurement sequence into partial acquisitions can result from the specific measurement sequence design.

For example, in a three-dimensional turbo-spin echo sequence, an excitation of the nuclear spins with subsequently acquisition of a series of spin echoes that are respectively generated by a refocusing pulse occurs multiple times. One or more preparation pulses with which different desired tissue contrasts (that are reflected in the acquired measurement data) are prepared can thereby precede the excitation of the nuclear spins. Due to this design of the measurement sequence, a division of the measurement sequence into partial acquisitions, given which each partial acquisition includes the acquisition of the series of spin echoes that respectively follow an excitation pulse, is advantageous. A corresponding number of k-space lines that are scanned via the series of spin echoes is hereby associated with each partial acquisition.

In a different sequence, a three-dimensional turbo-gradient echo sequence, the scanning of a k-space line ensues with gradient echoes that respectively follows each excitation pulse. A natural combination of individual gradient echoes into partial acquisitions can result by a contrast preparation that is respectively implemented for a predefined number of successive gradient echoes. Even when no contrast preparation is implemented—when the scanning of the k-space lines thus corresponds to a conventional three-dimensional gradient echo sequence—a random division of the measurement sequence into partial sequences can be effected in that, for example, a predefined number of successive gradient echoes are combined into a partial acquisition.

These statements apply in an analogous manner to other measurement sequences, for example to three-dimensional steady-state sequences, three-dimensional EPI sequences (EPI for "echo-planar imaging") or others.

The number of the k-space lines that is scanned in a partial acquisition can be different in each partial acquisition. Since the entirety of the k-space likes is scanned by the different partial acquisitions, the correlation applies: $\Sigma_{i=1}^{S} E_i = N$, whereby N specifies the number of the k-space lines and $E_i$ identifies the number of the k-space lines that are scanned during the i-th partial acquisition. S specifies the number of the partial acquisitions.

In a preferred embodiment, the number of the k-space lines that are scanned in each partial acquisition is essentially identical. In this case the number of the partial acquisitions S and the number of the k-space lines N to be scanned coincide with the number of the k-space lines E that are scanned during a partial acquisition:

$E = N/S$, wherein the quotient is possibly rounded off:

$E = \text{Ceil}(N/S)$;

the function Ceil rounds the quotients to the next largest integer value.

It can hereby occur that the available total number of k-space lines that can be scanned by the partial acquisitions, S*E, is slightly larger than the number of the k-space lines N to be scanned, this allows certain freedoms: for example, already-acquired k-space lines can also be re-scanned and the signal-to-noise ratio can be slightly increased with the excess k-space lines. Additional k-space lines can possibly be acquired, for example in the corners that otherwise remain entirely omitted given an elliptical k-space scan. However, fewer k-space lines can be scanned in total than is possible via the number S*E, such that slightly shorter measurement times are achieved. In this case the last scannable k-space lines can be skipped over in a portion of the partial acquisitions. In spite of this, a signal echo is preferably also generated for the k-space lines that are not to be scanned; this signal echo is ignored, however. The steady state of the magnetization is thus retained but nevertheless all echo trains are shortened in the same manner. This leads to an optimization of the point spread function.

In a fifth step 59, the k-space lines arranged in an order are grouped by combining successive k-space lines into one group. In a sixth step 61 the k-space lines are assigned to the individual partial acquisitions by, in each group, the k-space lines combined into this group are distributed among various partial acquisitions.

In the preferred embodiment, in which an essentially identical number of k-space lines is scanned in each partial acquisition, respectively S successive k-space lines are combined into a group in the fifth step 59. The apportioning (distribution) of the k-space lines to the individual partial acquisitions ensues in a sixth step 61, in that a k-space line from each group is respectively associated with each partial acquisition.

Figure 3:
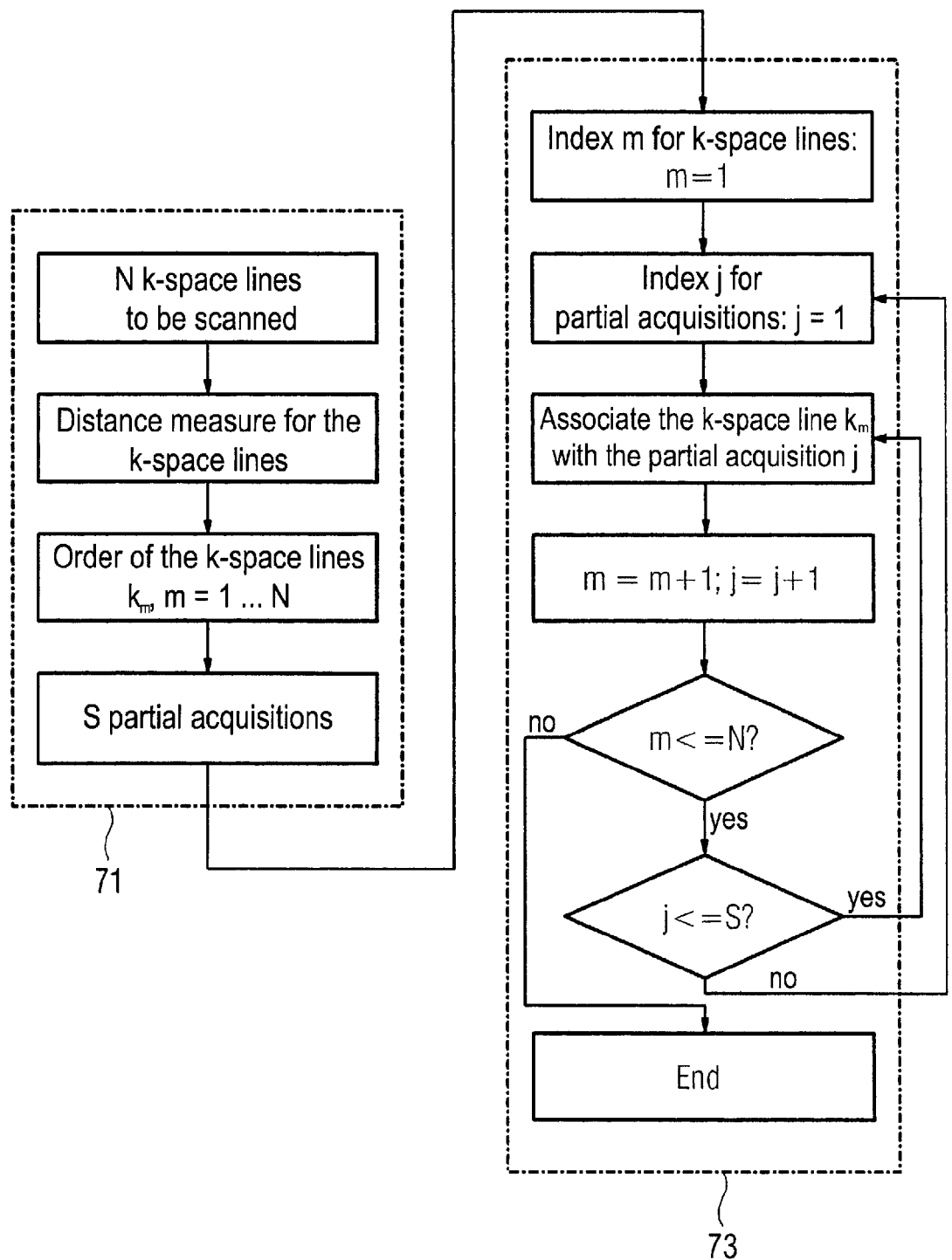
FIG. 3 is a flowchart of am embodiment of a method given wherein the association of k-space lines with partial acquisitions is implemented in detail in accordance with the invention.
Figure 4:
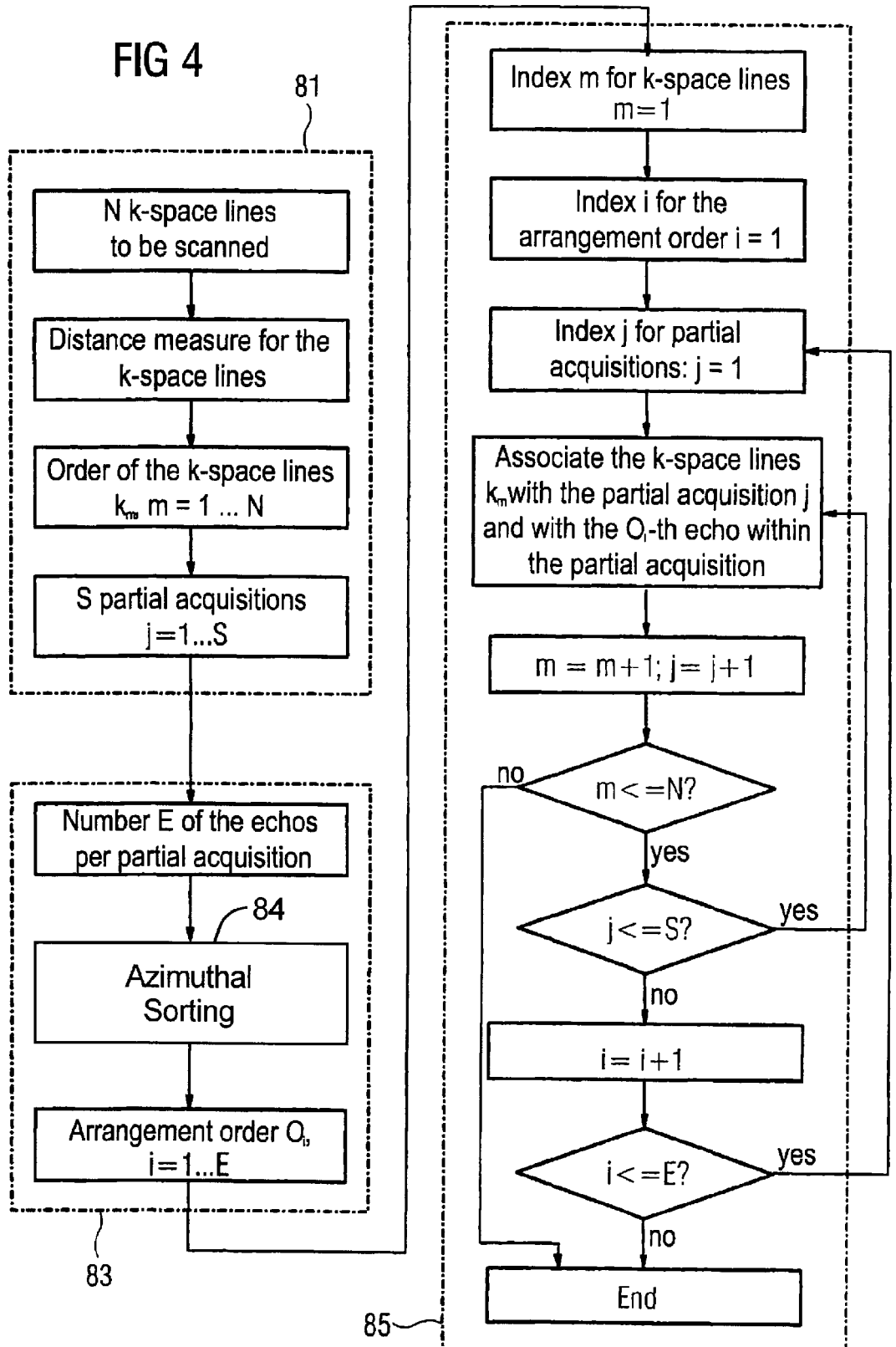
FIG. 4 is a flowchart of an embodiment of a method in which the association of k-space lines with partial acquisitions ensues under consideration of a desired scan order within the partial acquisitions in accordance with the invention.
Figure 5:
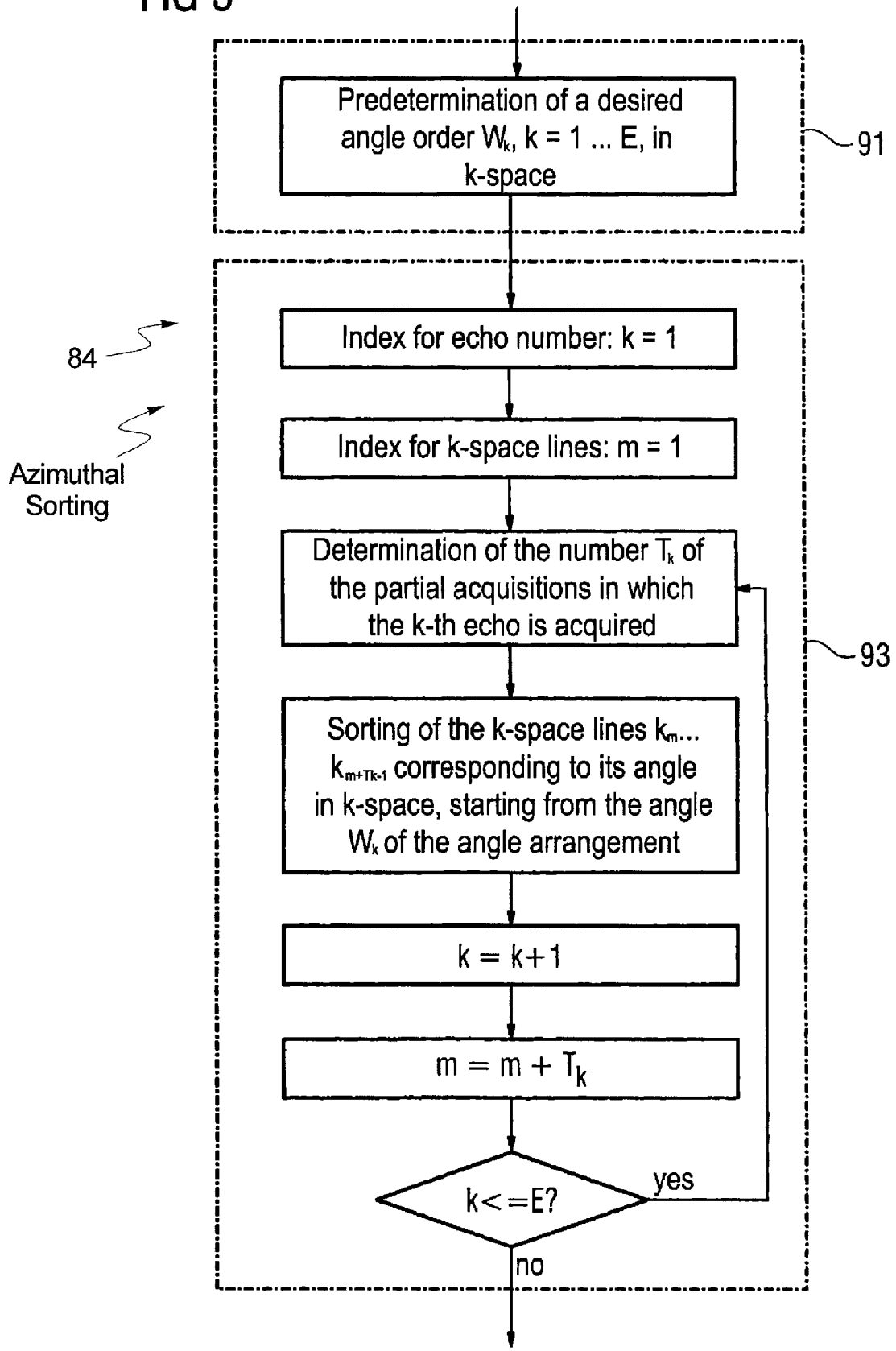
FIG. 5 is a flowchart of an embodiment of a method in which the k-space lines arranged in one order are reordered under consideration of the azimuthal position of the k-space lines in accordance with the invention.

Exemplary embodiments of how this can be implemented in an algorithm are shown in FIG. 3 through FIG. 5.

Further steps can improve the method. For example, after determination of the order of the k-space lines a seventh step 63 can be implemented in which the k-space lines arranged in an order are reorganized under consideration of their azimuthal position in k-space. It is thus possible to influence the otherwise largely random distribution of the k-space lines to the individual partial acquisitions with regard to their azimuthal position and to implement the distribution according to desired specifications.

Due to the consideration of the azimuthal position of the k-space lines, these can be arranged, for example, such that the phase coding gradients that are switched to scan the k-space lines change only slightly from k-space line to k-space line, such that eddy current effects occur less strongly and thus a better image quality is achieved. More detailed explanations regarding taking the azimuthal position of the k-space lines into account are explained below using FIG. 5.

For example, an arrangement order of the k-space lines associated with a partial acquisition can be determined in an eighth step 65 dependent on their distance from the k-space center, such that the scanning of the k-space lines can, for example, be tuned with a desired image contrast in this manner. More detailed explanations in this regard are explained below using FIG. 4.

Figure 2:
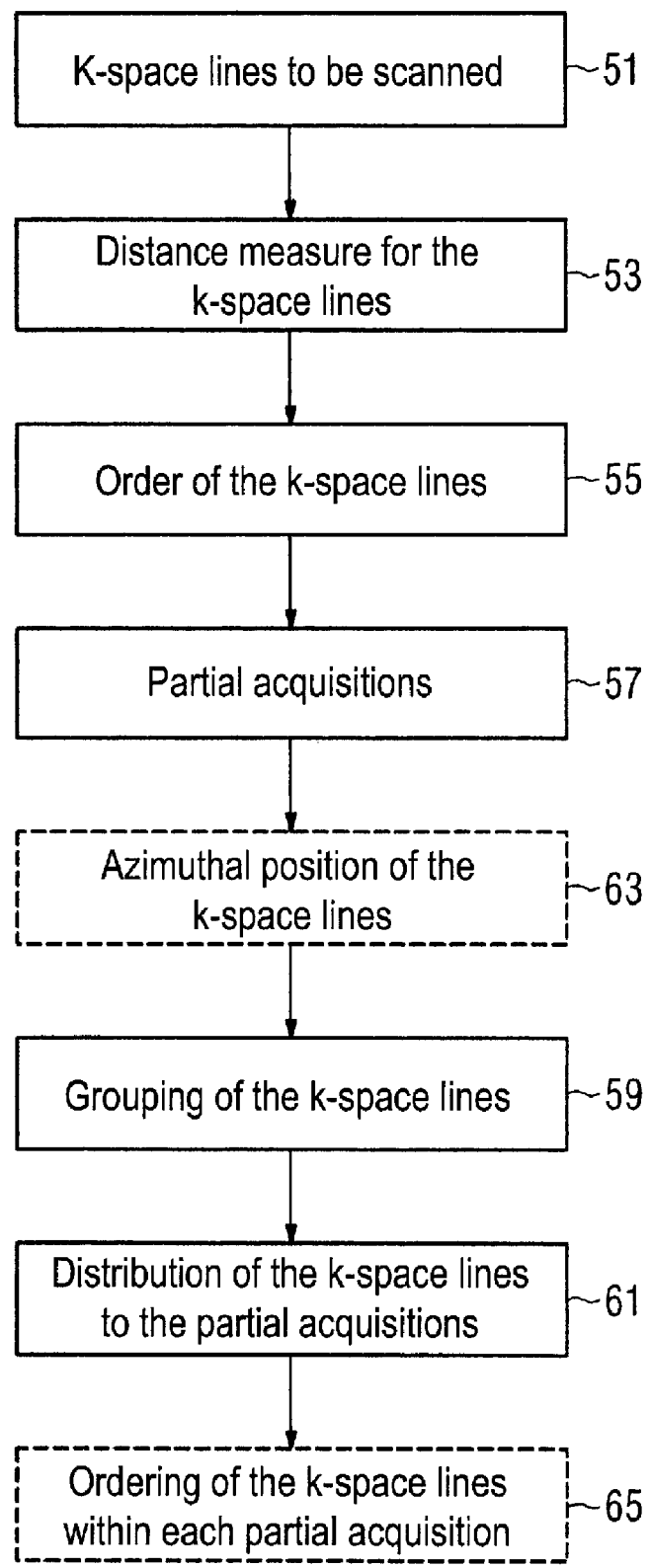
FIG. 2 illustrates an association rule according to which the k-space lines are associated with the partial acquisitions in accordance with the invention.

The order of the steps shown in FIG. 2 is only one possible order in which the steps are arranged. An algorithm that implements the steps shown in FIG. 2 can, for example, likewise implement a different order and also be fashioned such that a plurality of steps are executed simultaneously.

FIG. 3 shows an algorithm with which the k-space lines to be scanned can be distributed to the individual partial acquisitions according to the method. The specification of N k-space lines to be scanned, the arrangement of the N k-space lines to be scanned according to their distance from the k-space center in an order $k_m$, m=1 ... N, and the specification of the number S of the partial acquisitions ensue in a first part 71 of the algorithm according to FIG. 3 as described above. The actual association of the k-space lines with the partial acquisitions ensues in a second part 73 of the algorithm according to FIG. 3. The following steps are executed:

a) Extract the, k-space line with the shortest distance from the k-space center (thus $k_1$) from the sorted order of k-space lines $k_m$.
b) Associate this k-space line $k_1$ with the first partial acquisition.
c) Extract the next k-space line from the sorted order of k-space lines.
d) Associate this k-space line with the next partial acquisition.
e) Proceed until a k-space line has been associated with all partial acquisitions.
f) Extract the next element from the sorted order of k-space lines.
g) Associate this k-space line with the first partial acquisition.
h) Proceed until all k-space lines have been distributed to all partial acquisitions.

The sorted order of k-space lines is combined into groups via this association algorithm, in which S succeeding k-space lines are respectively grouped. A respective k-space line from the groups is thereupon associated with each partial acquisition.

For the subsequent explanations using FIG. 4 and FIG. 5, it is assumed in the following that the k-space scanning of the k-space lines is effected with a three-dimensional turbo-spin echo sequence, wherein, for a partial acquisition, the associated k-space lines are scanned by the echoes caused by the rephasing pulses. However, this serves only for illustration of the described statements. The generality of the described algorithms is not limited and can be adapted to other measurement sequence types (for example a turbo-gradient echo sequence with possible contrast preparation) without further measures.

FIG. 4 shows an algorithm with which, given the association of the k-space lines with the partial acquisitions, an arrangement of the k-space lines within each partial acquisition is realized, in a predetermined arrangement order with regard to their distance from the k-space center.

To explain the underlying concept, it is assumed in the following that nine successive spin echoes are acquired in a partial acquisition. Via a predetermined arrangement order it is established which of the associated k-space lines is scanned via the respective echo. The arrangement order can, for example, be specified via the sequence $O_i$, i=1, ... 9. The numbers 1 through 9 respectively indicate at which position a k-space line is scanned within the arrangement order, dependent on its distance from the k-space center.

For example, an arrangement order $O_i$={1, 2, 3, 5, 6, 7, 8, 9} means that the k-space line located nearest to the center of k-space is scanned via the first echo, the k-space line second-closest to the center of k-space is scanned as a second echo etc. A linearly increasing scanning of the k-space lines relative to their distance from the k-space center is thus ensured via this arrangement order.

For example, an arrangement order $O_i$={5, 4, 6, 3, 7, 2, 8, 1, 9} means that the k-space line located closest to the center of k-space is scanned via the fifth echo, that the k-space line located second-closest to the center of k-space is scanned via the fourth echo etc. The order of the scanning of the k-space lines is therefore central with regard to their distance from the k-space center, meaning that the most central k-space lines are scanned in the middle of a partial acquisition.

The first cited arrangement order is, for example, advantageous when the contrast is maximal at the beginning of the acquisition and decreases in the course of the acquisition. Such a case can, for example, occur when an acquisition of the echoes is effected with a turbo-gradient echo method and when a T2-weighted contrast preparation (as is known, for example, from Nezafat R. et al.: "B1-insensitive T2 preparation for improved coronary magnetic resonance angiography at 3 T.", Magn Reson Med., 2006 April, 55(4), 858-864) is effected in each partial acquisition before acquisition of the turbo-gradient echo. The T2-contrast hereby prepared is maximal immediately after the preparation and decays gradually in the course of the scanning of the echoes. The acquisition of the k-space lines in the linearly increasing order therefore corresponds to the time curve of the contrast behavior. The central k-space lines important for the image reconstruction are scanned with a better contrast for the first cited arrangement order while peripheral k-space lines are scanned with a poorer contrast.

The second cited arrangement order is, for example, advantageous when the contrast gradually builds up during the acquisition of the echoes and reduces again later. This can occur, for example, when the nuclear spins have been excited with an inversion pulse before the acquisition of the turbo-gradient echoes. The order of the k-space lines, in which the central k-space lines are acquired in the middle of the turbo gradient echo and the peripheral k-space lines are acquired at the beginning and the end, therefore corresponds to the time curve of the contrast behavior, such that central k-space lines are scanned with a better contrast.

It is also possible to effect other contrast preparations such as, for example, a diffusion contrast or a T1ρ-contrast and to adapt the arrangement order of the k-space lines within a partial acquisition to the curve of the prepared contrast.

The specification of N k-space lines to be scanned, the arrangement of the N k-space lines to be scanned in an order $k_m$, m=1 ... N according to their distance from the k-space center, and the specification of the number S of the partial acquisitions ensues in a first part 81 of the algorithm according to FIG. 4, analogous to the exemplary embodiment described in FIG. 3. The determination of the number E of the echoes that are acquired per partial acquisition ensues in a second part 83 of the algorithm according to FIG. 4, for example according to the formulas described in the specification regarding FIG. 2. Furthermore, a desired arrangement order $O_i$, i=1 ... E is predetermined based on the number E of the echoes. An expansion 84 of the algorithm can be shifted within this part, as explained below using FIG. 5.

Assuming these specifications, the association of the k-space lines with the partial acquisitions and with the position with which they are scanned within the associated partial acquisition ensues via an algorithm realized with loops in a third part 85 of the algorithm according to FIG. 4. The following steps are executed:

a) Extract the k-space line with the shortest distance from the k-space center from the sorted order of k-space lines.

b) Associate this k-space line with the first partial acquisition and, within the first partial acquisition, with that echo that is at the first position in the order $O_i$.

c) Extract the next element from the sorted order of k-space lines.

d) Associate this k-space line with the second partial acquisition and, within the second partial acquisition, with that echo that is at the first position in the order $O_i$.

e) Proceed until in all partial acquisitions a k-space line has been associated with that echo that is at the first position in the order $O_i$.

f) Extract the next element from the sorted order of k-space lines.

g) Associate this k-space line with the first partial acquisition and, within the first partial acquisition, with that echo that is at the second position in the order $O_i$.

h) Proceed until a k-space line is associated with all echoes in all partial acquisitions.

It should be noted that all echoes in each partial acquisition are possibly not allocated with a k-space line since—as described above—the total number of the k-space lines (S*E) that can be scanned via the partial acquisitions can be greater than the total number of the k-space lines (N) to be scanned. The excess echoes can thus be omitted in the association. The "skipped" few echoes can be implemented without further measures in the algorithm in the association of the k-space lines with the echoes. A redundant allocation of specific k-space lines to the excess echoes or also an association of additional k-space lines can likewise be implemented in the algorithm in a simple manner.

Particularly for the case that k-space lines should be scanned multiple times (and for example an averaging is implemented to increase the signal-to-noise ratio), a random permutation of the order of the partial acquisitions can subsequently ensue. It is therewith prevented that the measurement of the identical k-space line ensues in immediately successive segments. The efficiency of the averaging to reduce movement artifacts is increased in this manner.

A sorting of the k-space lines associated with a partial acquisition with regard to their distance from the k-space center (thus in the radial direction) is achieved with the algorithm previously described in FIG. 4. The azimuthal arrangement of the k-space lines in k-space is not taken into account;

the k-space lines are therefore largely unsorted in this regard. A certain regularity in the distribution does in fact result from the association between the raster in which the k-space lines are arranged and the radial sorting; this sorting is, however, often insufficient and corresponds in general to an unwanted arrangement. Given a missing azimuthal sorting, the phase coding gradients of two successive echoes can therefore deviate strongly from one another, which, in the case of non-ideal hardware (for example due to eddy current effects), can lead to image artifacts or to an increased noise level in the scanning of the k-space matrix. To avoid this problem, the algorithm from FIG. 4 can be expanded with an azimuthal sorting 84. This azimuthal sorting 84 is now described using FIG. 5.

In a first part 91 of the algorithm according to FIG. 5, an establishment ensues of the angle distribution $W_i$ of the k-space lines in k-space that should be taken into account via the association of the k-space lines. The underlying concept here is now explained with reference to the example above, in which nine successive echoes are acquired in a partial acquisition.

For example, an angle order $W_1=\{0, 0, 0, 0, 0, 0, 0, 0, 0\}$ indicates that an angle of the k-space lines should be used with optimal constancy within a partial acquisition. In connection with a linearly increasing arrangement order $O_i=\{1, 2, 3, 4, 5, 6, 7, 8, 9\}$ as it is described above, a radial scanning scheme and a segmentation of the k-space into approximately radial segments results from this to a good approximation.

For example, an angle order $W_i=\{0, 0, 0, 0, 0, \pi, \pi, \pi, \pi\}$ means that the first half of the echoes within the partial acquisition should be populated with k-space lines with an optimally constant azimuthal angle and the second half of the echoes should in turn be populated with an azimuthal angle offset by π (180°). In connection with a central arrangement order $O_i=\{5, 4, 6, 3, 7, 2, 8, 1, 9\}$ (see above), a real diametric scanning scheme results in good approximation such that approximately opposite k-space lines are scanned within a partial acquisition.

For example, an angle order $W_i=\{0, \pi/8, \pi/4, 3\pi/8, \pi/2, 5\pi/8, 3\pi/4, 3\pi/8, \pi\}$ indicates that the angle of the individual k-space lines should be incrementally increased. A spiral arm results per π in connection with a linearly increasing arrangement order $O_i=\{1, 2, 3, 4, 5, 6, 7, 8, 9\}$, whereby narrower and wider spirals can be achieved in an analogous manner.

The adaptation of the k-space lines arranged in an order to the desired angle scheme can be effected with this specification. A second part 93 of the algorithm according to FIG. 5 is implemented for this:

a) Consider all partial acquisitions in which the first echo is populated with a k-space line. The number of these partial acquisitions is $T_1$. In general this equals of all partial acquisitions S. Only given the last echo does it occur that the number of the partial acquisitions in which the last echo is populated can be smaller, since not all echoes of the partial acquisitions must be populated with k-space lines (for the reasons explained above).
b) Sort the first $T_1$ k-space lines from the radially sorted order of k-space lines $k_i$ according to their angle in k-space, and in fact beginning with the first angle of the angle order $W_i$.
c) Consider all partial acquisitions in which the second echo is populated with a k-space line. The number of these segments is $T_2$.
d) Sort the next $T_2$ elements of the radially sorted order of k-space lines $k_i$ according to their angle in k-space, beginning with the second angle of the angle order $W_i$.
e) Proceed until all echoes are sorted according to the angle.

The angle of a k-space line, which thus specifies the azimuthal position of the k-space line within the k-space, can be calculated in a known manner. Analogous to the distance norm, a scaling of k-space can also be effected in the calculation of an angle. Given k-space with a Cartesian scanning grid whose k-space lines are arranged in two phase coding directions x and y and are characterized by the coordinates $k_x$ and $k_y$, the angle of the k-space line can, for example, be determined via the following correlation:

$$a(k_x, k_y) = a \tan 2((k_x - k^0_x)/K_x, (k_y - k^0_y)/K_y),$$

wherein $k^0_x$ and $k^0_y$ specify the coordinates of the k-space center and $K_x$ and $K_y$ specify the grid points of the Cartesian scanning grid in the x- and y-directions. The function atan 2(x, y) thereby calculates the arc tangent of the two arguments x and y. This largely corresponds to the arc tangent from x/y, wherein the algebraic sign of both arguments is evaluated and the quadrant of the result is thus determined. The periodicity of the angle is used in the sorting, for example $-a = 2\pi - a$.

An illustration of the apportionment of the k-space lines 103 to a plurality of partial acquisitions in various embodiments of the inventive measurement sequence as well as in measurement sequences known from the prior art is now shown using FIG. 6 through FIG. 12. The illustration ensues using a Cartesian, three-dimensional k-space matrix 101 that has a size of 5×5. Thereby shown are the two phase coding directions, designated here as x-direction and y-direction. Not shown is the readout direction of the three-dimensional k-space matrix 101 that appears perpendicular to the plane of the phase coding directions.

The small size (5×5) of the k-space matrix 101 hereby serves merely for illustration and for explanation of the principle according to which an apportioning and association of the k-space lines 103 to partial acquisitions ensues. Much larger k-space matrixes are typically used for MR imaging. In the examples shown here the 25 k-space lines 103 are apportioned to five partial acquisitions. The five partial acquisitions are designated by letters (A, B, C, D, E). The digits before the letters respectively indicate the position of the scan of the k-space line 103 within a partial acquisition.

Figure 6:
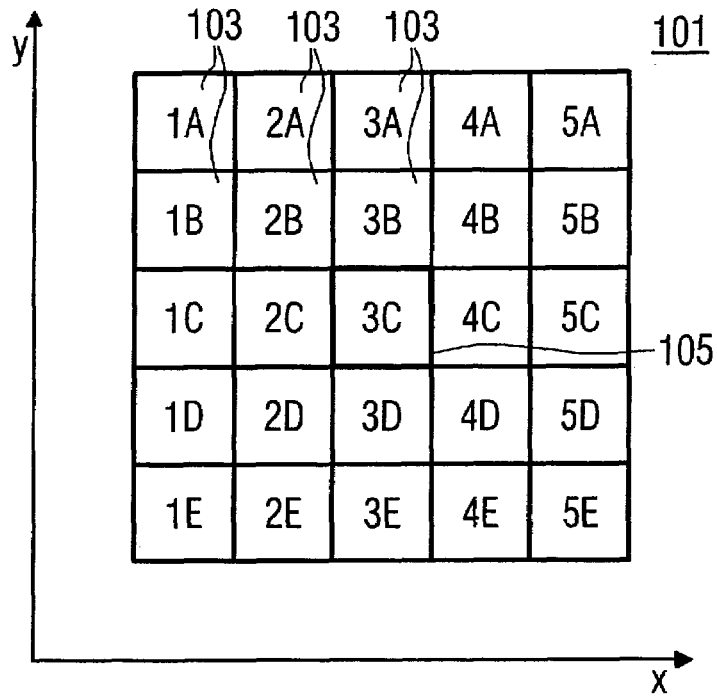
FIG. 6 and FIG. 7 respectively, show k-space matrices with scanning schemes as are known in the prior art.
Figure 7:
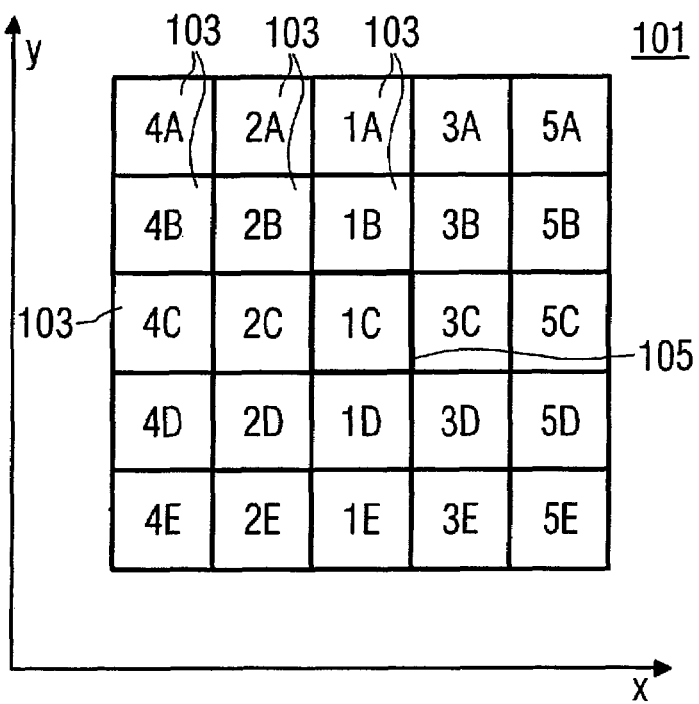

FIG. 6 and FIG. 7 show an apportioning of the k-space lines 103 to partial acquisitions as are known from the prior art.

A grouping of the 25 k-space lines 103 corresponding to their coordinates in the y-direction and an association with five partial acquisitions are effected in FIG. 6. During a partial acquisition, the scanning of five associated k-space lines 103 ensues in the x-direction; the order of the scanning of the k-space lines 103 within a partial acquisition is characterized by characters (1, 2, 3, 4, 5).

FIG. 7 likewise shows an analogous grouping of the k-space lines 103 and association with individual partial acquisitions. However, in contrast to FIG. 6, a scanning of the k-space lines 103 within a partial acquisition ensues starting from the central k-space line 103 towards both directions with interval from the center becoming increasingly larger.

Figure 8:
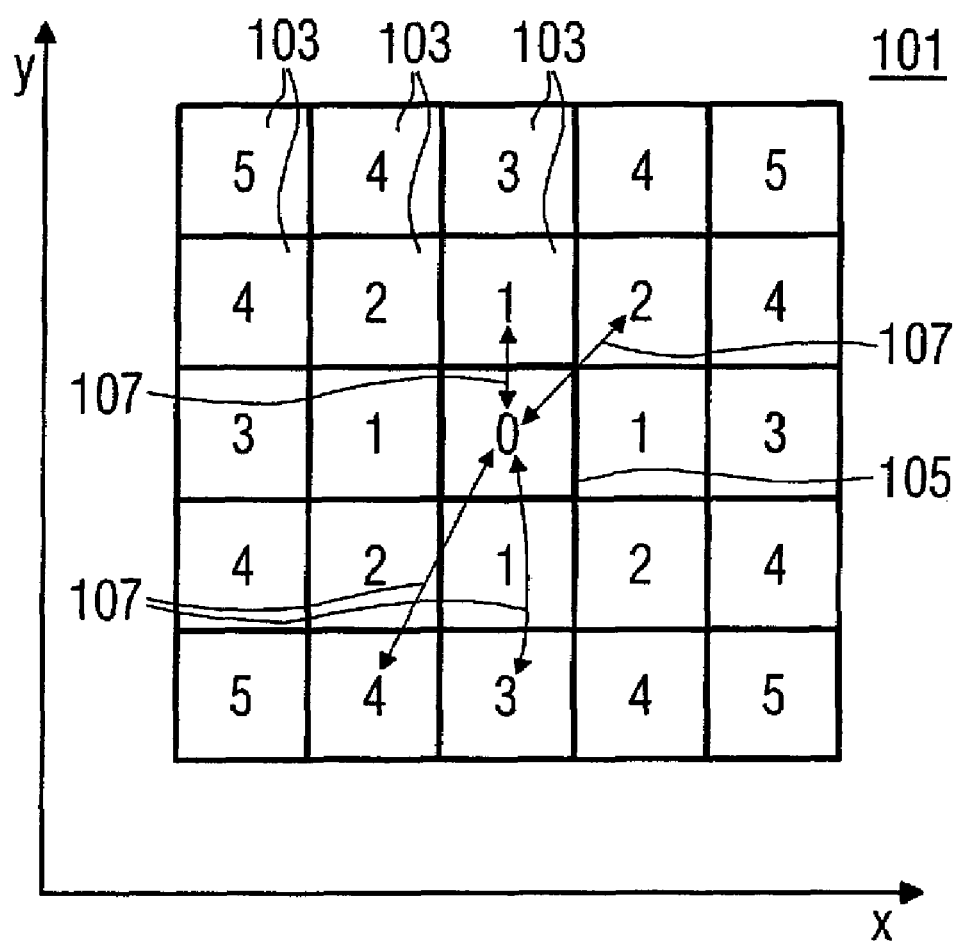
FIG. 8 illustrates an evaluation of the k-space lines of a k-space matrix with regard to their interval from the k-space center in accordance with the invention.

FIG. 8 shows an assessment of the k-space lines of the 5×5 k-space matrix 101 with a measure that respectively assesses its distance 107 relative to a k-space center 105. A classification of the k-space lines 103 can ensue with the distance measure shown here, to the effect that k-space lines 103 with a smaller measure are located closer to the k-space matrix 105 than k-space lines with a larger measure. The arrangement of the k-space lines 103 in an order ensues based on this assessment, such that the association of the k-space lines 103 with the individual partial acquisitions ensues based thereon.

Figure 9:
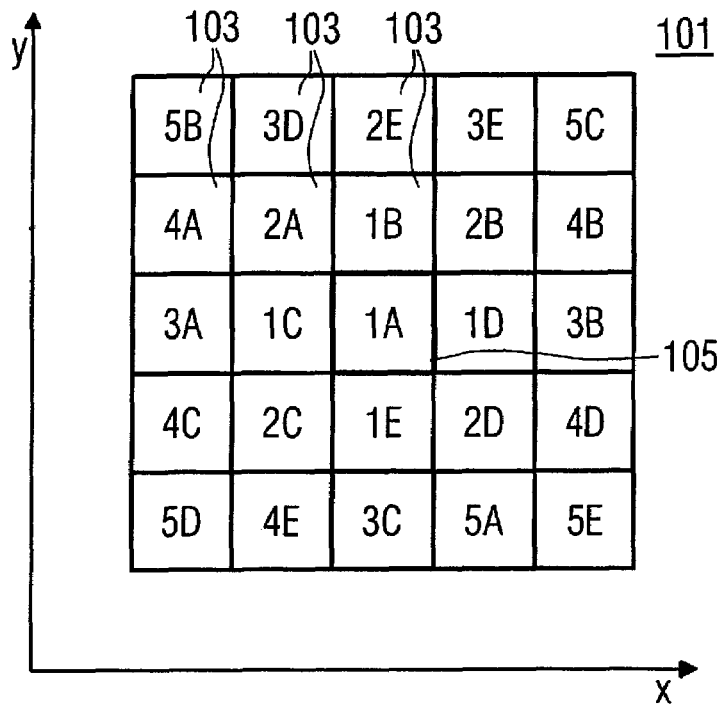
FIG. 9 through FIG. 12 respectively, show k-space matrices with scanning schemes as are generated with methods according to FIG. 3 through 5.

FIG. 9 shows an apportioning of the 25 k-space lines 103 to rive partial acquisitions as it can be generated via an algorithm according to FIG. 4. Both central and peripheral k-space lines have been associated with each partial acquisition (A, B, C, D, E), and in fact such that a largely uniform assignment of k-space lines 103 arranged in the two-dimensional the phase coding plane to the five partial acquisitions results. The arrangement order $O_i=\{1, 2, 3, 4, 5\}$ of the k-space lines 103 within a partial acquisition corresponds to a radial scanning starting from the k-space center 105. This means that the k-space lines 103 have been associated with the individual partial acquisitions from the inside out, meaning that within a partial acquisition k-space lines 103 that are situated further towards the center are scanned before k-space lines 103 that are situated further toward the periphery. In the association the azimuthal position of the k-space lines 103 is not taken into account, such that the azimuthal distribution of the k-space lines 103 to the individual partial acquisitions is largely random.

Figure 10:
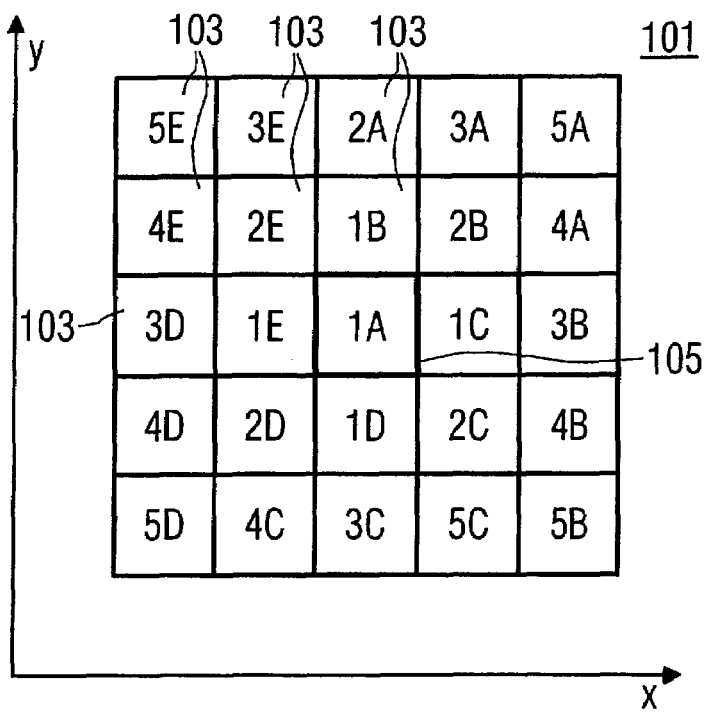

In contrast to this, the association in FIG. 10 ensues analogous to that in FIG. 9; however, this time an angle sorting according to the scheme $W_i=\{0, 0, 0, 0, 0\}$ was taken into account via an expansion of the association algorithm according to FIG. 5. This means that, although the k-space lines 103 are scanned radially starting from the center, as before, the angle position of the k-space lines 103 has likewise been taken into account in the association. A essentially segment-like scanning of the k-space lines 103 results from this.

Figure 11:
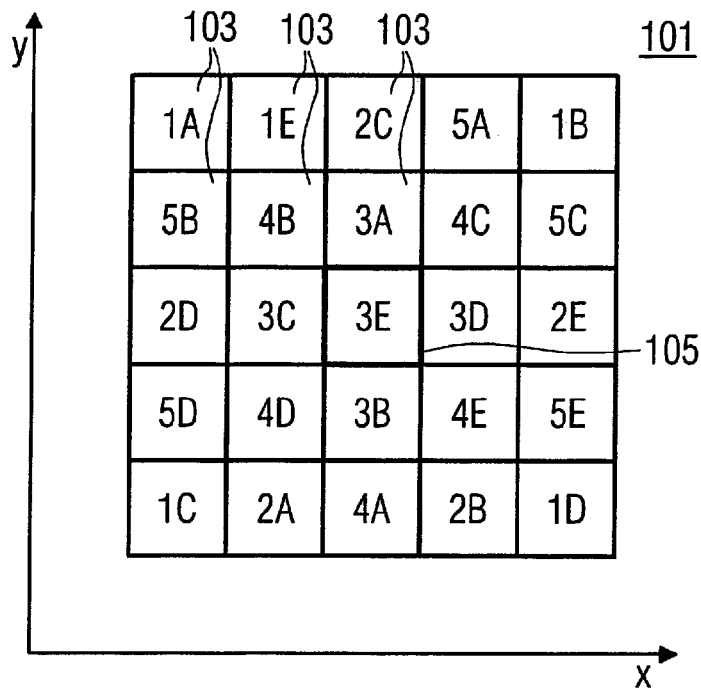

FIG. 11 shows an apportioning of the k-space lines 103 to the fifth partial segments, analogous to FIG. 9. In contrast to FIG. 9, a central arrangement order $O_i=\{5, 3, 1, 2, 4\}$ was now taken into account in the association, such that now the central k-space lines 103 are scanned in the middle of a partial acquisition (at the third position) and the peripheral k-space lines 103 are respectively scanned at the beginning or, respectively, at the end of the partial acquisition (at the first or, respectively, fifth position). No consideration of the azimuthal position of the k-space lines 103 has occurred in FIG. 11 in the association with the individual partial acquisitions.

Figure 12:
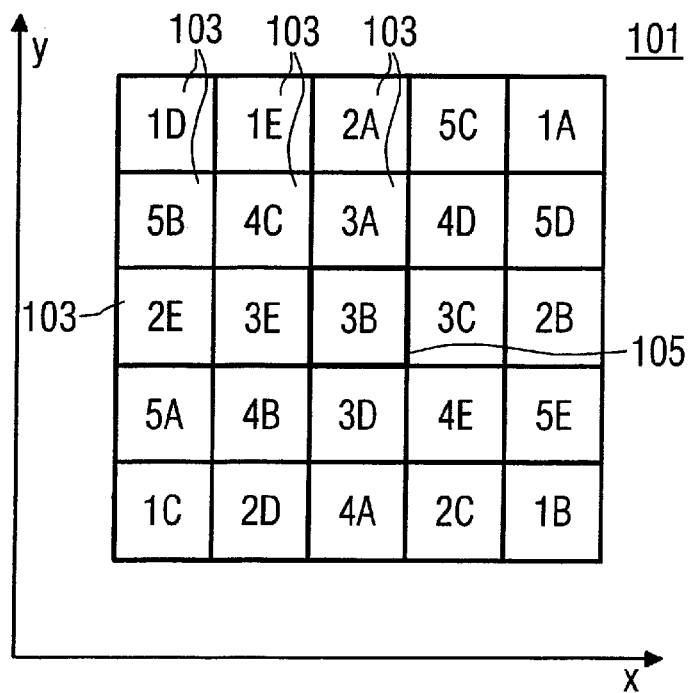

FIG. 12 shows an apportioning of the k-space lines 103 according to FIG. 11, this time with consideration of an angle sorting $W_i=\{0, 0, 0, \pi, \pi\}$. A diametric scanning scheme thereby results in connection with the central arrangement order from FIG. 11, such that the k-space lines 103 scanned in a partial acquisition are situated approximately diametrically opposite in k-space. In the k-space matrix 101 shown here, the diametric scanning scheme is to be recognized as merely indicated due to the small matrix size.

For the special case of methods segmented a priori, for example turbo-spin echo methods or turbo-gradient echo methods, a sharper point image function often results as a further advantage due to the specific arrangement of the k-space lines according to the association rules according to FIG. 3 through FIG. 5. Given the methods segmented a priori, a continuous modification of the contrast or brightness information stored in the magnetization often occurs during the scanning of the k-space lines of a partial acquisition due to relaxation effects.

Figure 13:
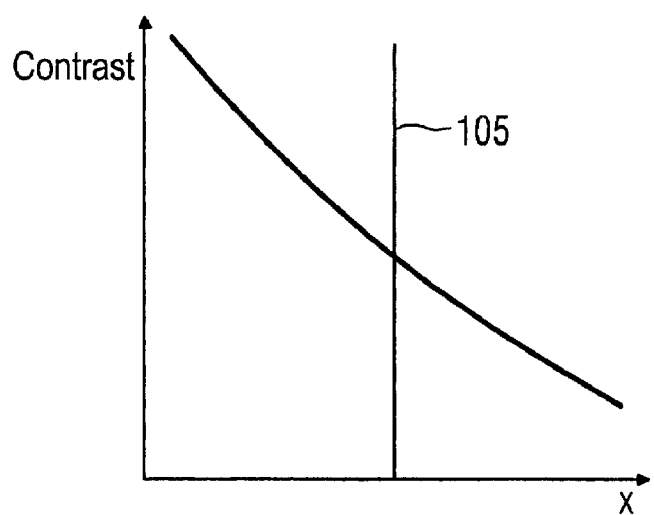
FIG. 13 through FIG. 15 respectively show three contrast distributions in k-space that result from various scanning schemes in accordance with the invention.

For example, if (analogous to FIG. 6) a complete y-line of k-space is scanned in the x-direction in each partial acquisition, the contrast to be scanned changes during the acquisition; this change can be described with a change function. For example, if the contrast is at maximum at the beginning of a partial acquisition and gradually decays, a drop of the contrast in the x-direction results according to FIG. 13.

The Fourier-transformed change function renders the point spread function: the greater the relaxation or, respectively, the change of the contrast, the more smeared that image contours appear. Since the change of the contrast—due to the scanning scheme—predominantly occurs in the x-direction while the contrast in the y-direction remains the same, this also generates an asymmetrical point spread function that is smeared in the x-direction and comparably sharp in the y-direction.

Figure 14:
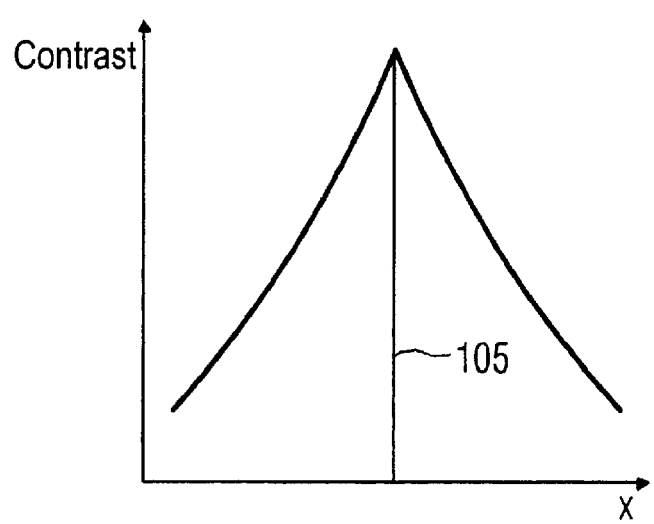

This phenomenon is strongly pronounced in central scanning schemes (analogous to FIG. 7): starting from the k-space center, k-space is scanned along a phase coding direction towards both sides up to the limits. If a contrast decays in the course of the scanning, change functions resulting from this arise in the x-direction, which change functions are presented in FIG. 14. Here as well the change function is constant in the y-direction. An asymmetrical point image function that is sharp in the y-direction and blurry in the x-direction also results from this.

Figure 15:
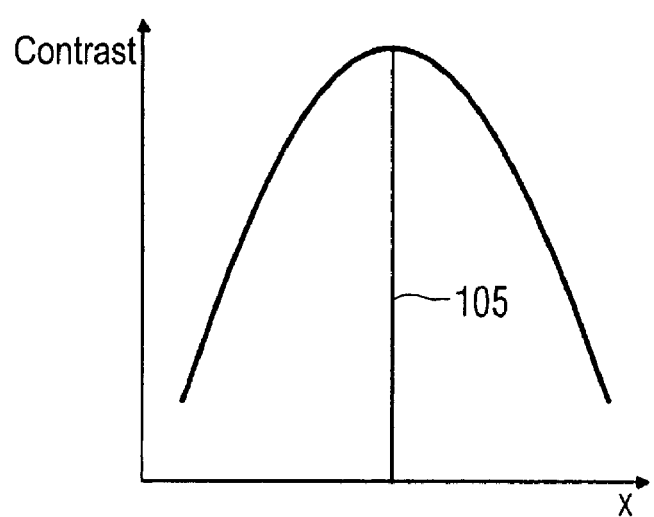

In contrast to this, given identical contrast drops, and with a scanning scheme given an inventive measurement sequence (for example given the scanning scheme analogous to FIG. 9), a change function is found that decays slower in the center of k-space and contrarily faster at the edges. This drop occurs both in the x-direction (shown in FIG. 15) and in the y-direction. If the resulting point spread functions are compared, given a measurement sequence analogous to FIG. 9 a more symmetrical point spread function is found which (compared with the point spread function given conventional scanning schemes) exhibits a narrower distribution in the partition direction and contrarily a somewhat wider distribution in the line direction. However, overall a desirable, symmetrical point spread function is obtained in all phase coding directions.

Although modifications and changes may be suggested by those skilled in the art, it is the intention of the inventor to embody within the patent warranted hereon all changes and modifications as reasonably and properly come within the scope of his contribution to the art.

I claim as my invention:

1. A data acquisition method for three-dimensional magnetic resonance imaging comprising the steps of:

acquiring magnetic resonance data from an examination subject and entering the magnetic resonance data into a plurality of k-space lines in k-space in order to produce a data set, representing a three-dimensional magnetic resonance image;

in the acquisition of said magnetic resonance data, apportioning said plurality of k-space lines among a plurality of partial data acquisitions so that data entry into multiple k-space lines occurs in each of said partial acquisitions; and associating said k-space lines with said partial acquisitions by:

evaluating each k-space line to identify a Euclidean distance measure associated with that k-space line representing a distance of that k-space line from a center of k-space, arranging the k-space lines into which said magnetic resonance data are to be entered in an order dependent on the respective distance measures associated with the k-space lines, grouping the k-space lines in said order into a plurality of groups by combining a plurality of successive k-space lines into respective groups, and associating the k-space lines with the respective partial acquisitions by, in each group, apportioning the k-space lines combined into that group to different ones of said partial acquisitions.

2. A method as claimed in claim 1 wherein S indicates the number of said partial acquisitions, and comprising:

grouping said k-space lines into said groups by combining S successive k-space lines into each group; and associating the k-space lines with said partial acquisitions by, in each group, assigning the S successive k-space lines to the S partial acquisitions.

3. A method as claimed in claim 1 comprising employing non-intersecting lines in k-space as said k-space lines.

4. A method as claimed in claim 1 comprising, in the acquisition of said magnetic resonance data, reading said magnetic resonance data out in a readout direction, and arranging said k-space lines in k-space parallel to said readout direction.

5. A method as claimed in claim 1 comprising employing lines lying on a three-dimensional Cartesian grid as said k-space lines.

6. A method as claimed in claim 1 comprising entering said magnetic resonance data into said k-space lines in a sequence of increasing distance measures.

7. A method as claimed in claim 1 comprising modifying a sequence in which said magnetic resonance data are entered into the respective k-space lines dependent on respective azimuthal positions of the k-space lines in k-space.

8. A method as claimed in claim 1 comprising entering data into the respective k-space lines within each partial acquisition dependent on the respective distance measures of the k-space lines associated with that partial acquisition.

9. A method as claimed in claim 8 comprising entering data into the respective k-space lines within each partial acquisition matched to an image contrast that varies during entry of the data, to cause central k-space lines in a central region of k-space to occur at a time of strongest image contrast.

10. A method as claimed in claim 1 comprising acquiring said magnetic resonance data using at least one of spin echoes and gradient echoes.

11. A method as claimed in claim 10 comprising acquiring said magnetic resonance data using a multi-echo technique wherein multiple echoes, in which data for a plurality of k-space lines are acquired, follow after an excitation pulse.

12. A method as claimed in claim 10 comprising executing a contrast preparation before each partial acquisition.

13. A method as claimed in claim 1 comprising identifying said Euclidean distance measure as a Euclidean distance norm of the respective k-space lines from the k-space center.

14. A method as claimed in claim 1 comprising scaling k-space dependent on a size of k-space to be filled with said magnetic resonance data, in identifying the respective distance measures associated with said k-space lines.

15. A magnetic resonance apparatus configured for three-dimensional magnetic resonance imaging comprising:
  a magnetic resonance scanner configured to interact with an examination, and a control unit that operates said scanner in order to acquire magnetic resonance data from the examination subject and in order to enter the magnetic resonance data into a plurality of k-space lines in k-space space in order to produce a data set, representing a three-dimensional magnetic resonance image;
  in the acquisition of said magnetic resonance data, said control unit apportioning said plurality of k-space lines among a plurality of partial data acquisitions so that data entry into multiple k-space lines occurs in each of said partial acquisitions; and
  said control unit being configured to associate said k-space lines with said partial acquisitions by:
  evaluating each k-space line to identify a Euclidean distance measure associated with that k-space line representing a distance of that k-space line from a center of k-space,
  arranging the k-space lines into which said magnetic resonance data are to be entered in an order dependent on the respective distance measures associated with the k-space lines,
  grouping the k-space lines in said order into a plurality of groups by combining a plurality of successive k-space lines into respective groups, and
  associating the k-space lines with the respective partial acquisitions by, in each group, apportioning the k-space lines combined into that group to different ones of said partial acquisitions.

* * * * *